(12) United States Patent
Nonaka

(10) Patent No.: US 9,157,978 B2
(45) Date of Patent: Oct. 13, 2015

(54) MAGNETIC RESONANCE IMAGING APPARATUS AND METHOD

(75) Inventor: Masayuki Nonaka, Tokyo (JP)

(73) Assignee: HITACHI MEDICAL CORPORATION, Tokyo (JP)

( * ) Notice: Subject to any disclaimer, the term of this patent is extended or adjusted under 35 U.S.C. 154(b) by 1058 days.

(21) Appl. No.: 13/257,124

(22) PCT Filed: Mar. 17, 2010

(86) PCT No.: PCT/JP2010/054489
§ 371 (c)(1),
(2), (4) Date: Sep. 29, 2011

(87) PCT Pub. No.: WO2010/107041
PCT Pub. Date: Sep. 23, 2010

(65) Prior Publication Data
US 2012/0019248 A1  Jan. 26, 2012

(30) Foreign Application Priority Data
Mar. 18, 2009 (JP) ................................. 2009-066476

(51) Int. Cl.
*G01R 33/385* (2006.01)
*G01R 33/48* (2006.01)
*G01R 33/561* (2006.01)
*G01R 33/24* (2006.01)
*G01R 33/36* (2006.01)

(52) U.S. Cl.
CPC .......... *G01R 33/5611* (2013.01); *G01R 33/246* (2013.01); *G01R 33/3664* (2013.01)

(58) Field of Classification Search
CPC ............. G01R 33/246; G01R 33/3664; G01R 33/5611
USPC .......................... 324/307–309, 313, 318, 320
See application file for complete search history.

(56) References Cited

U.S. PATENT DOCUMENTS 8,253,415 B2 * 8/2012 Umeda .......................... 324/307

FOREIGN PATENT DOCUMENTS

JP  2000-23938  1/2000
JP  2008-5943   1/2008

OTHER PUBLICATIONS

Pruessmann, Klaas P., et al. "SENSE: sensitivity encoding for fast MRI." Magnetic resonance in medicine 42.5 (1999): 952-962.*
Machine translation of JP 2008005943.*
Machine translation of JP 2000023938.*
International Search Report in PCT/JP2010/054489.

* cited by examiner

*Primary Examiner* — Melissa Koval
*Assistant Examiner* — Rishi Patel
(74) *Attorney, Agent, or Firm* — Cooper & Dunham LLP

(57) ABSTRACT

When imaging for sensitivity distribution measurement is performed, a whole-body coil for both transmission and reception and a specified coil used for the present imaging are used as a reception coil, while being switched.
The switching of the reception coil is performed by switching between the whole-body coil and the specified coil for each echo in the same encode step.
An image created from the echo obtained by the specified coil is divided by an image created from the echo obtained by the whole-body coil to calculate the sensitivity distribution of the specified coil.
The sets of data used for the calculation are almost simultaneously obtained, thus providing accurate sensitivity distribution with no influence derived from the movement of a subject.
The sensitivity distribution is used to correct the image obtained by the present imaging.
Alternatively, the sensitivity distribution is used for the folding operation of parallel imaging.

20 Claims, 11 Drawing Sheets

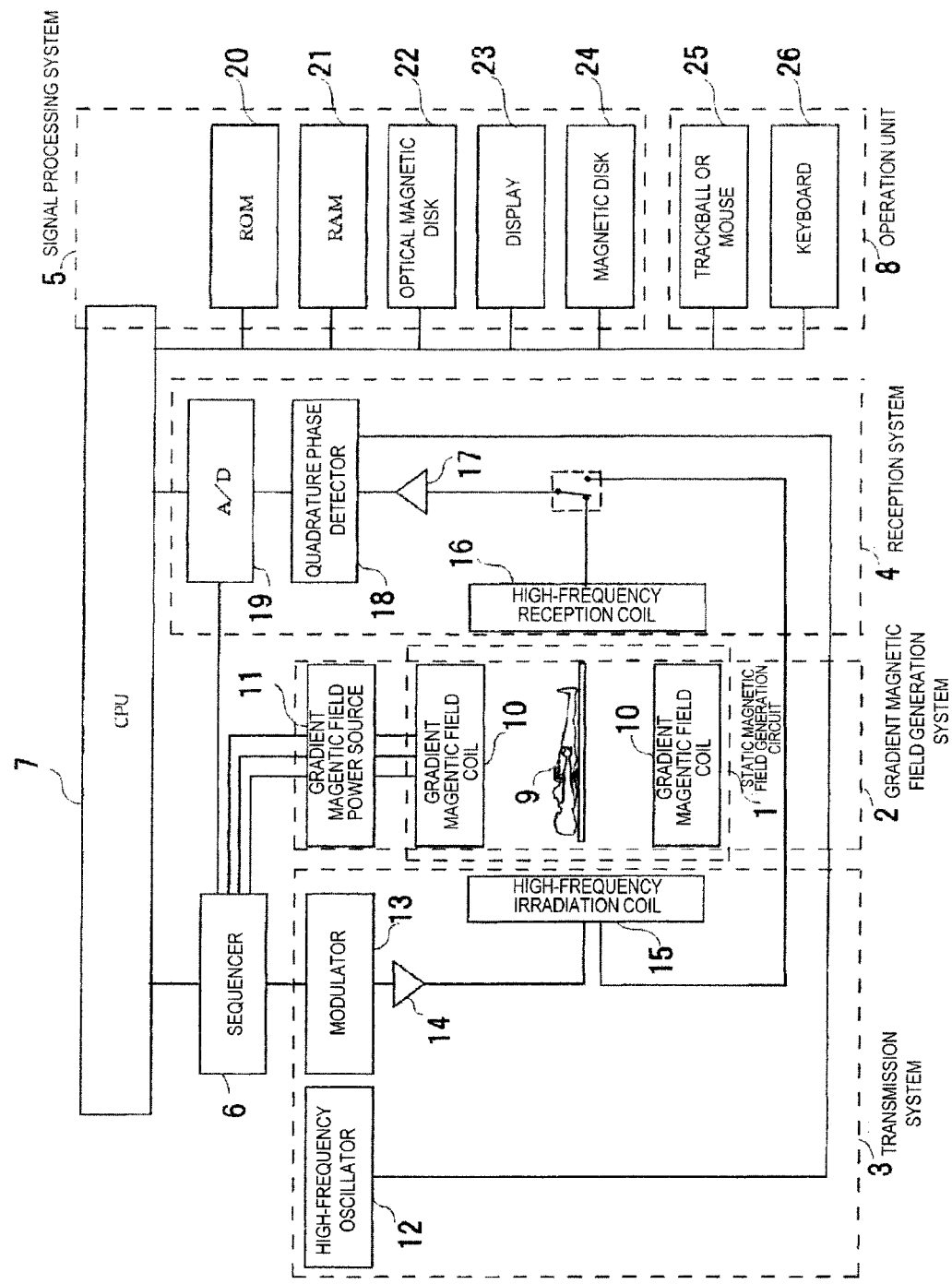

F I G . 2
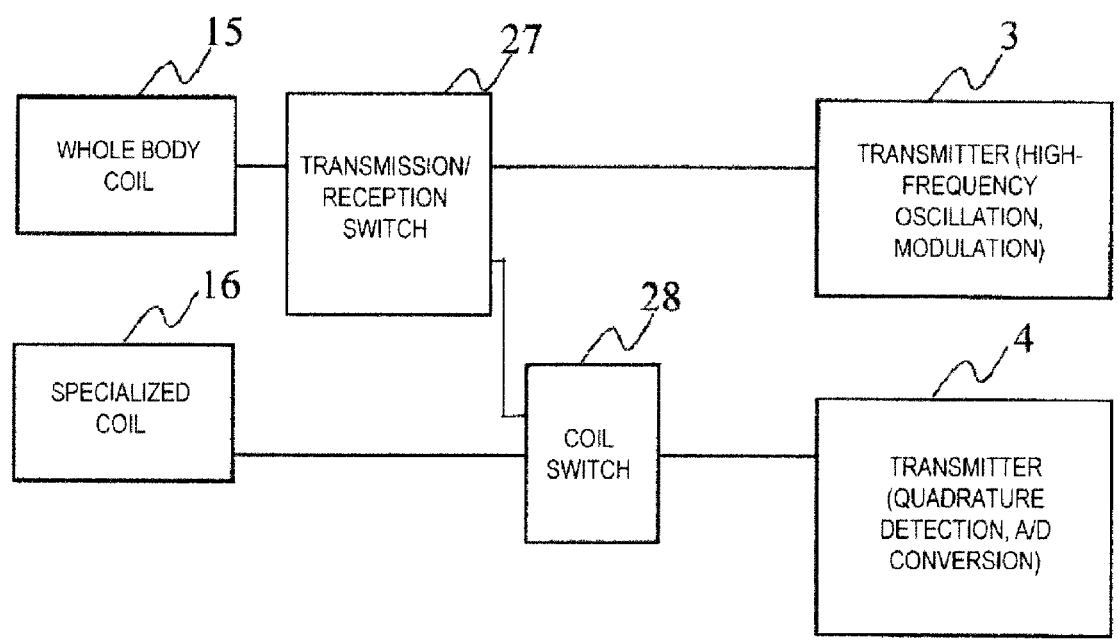

F I G . 6
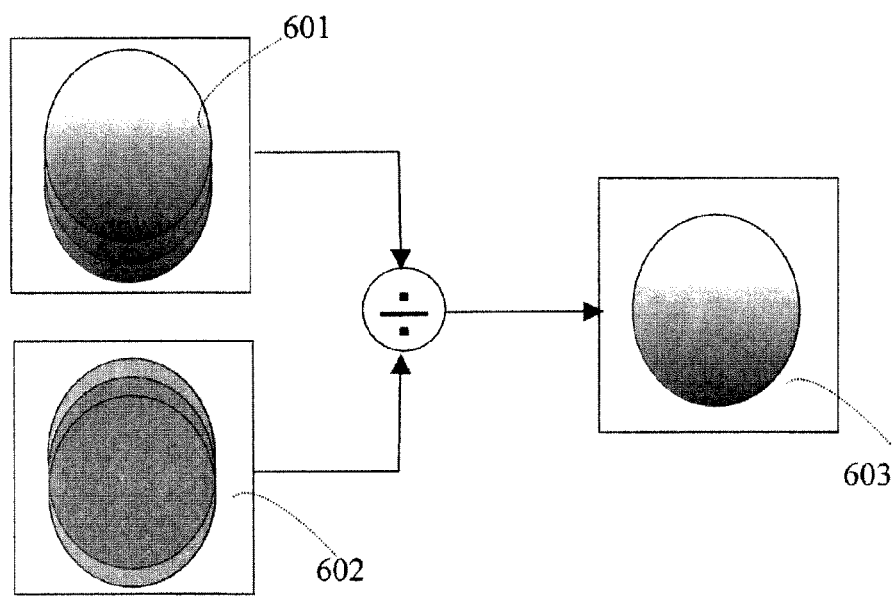

F I G . 7
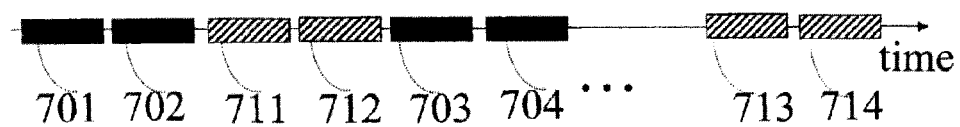

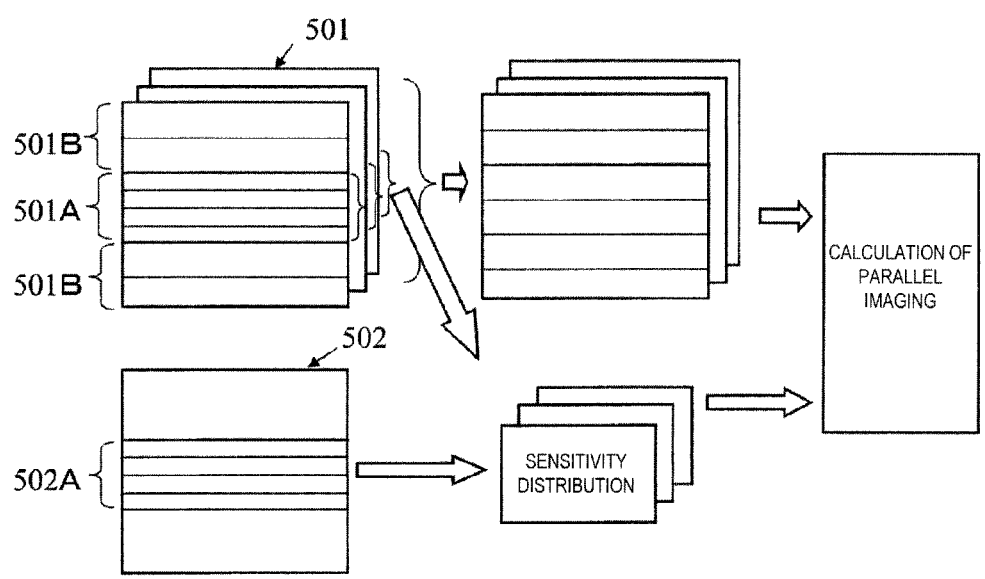
F I G . 1 1

MAGNETIC RESONANCE IMAGING APPARATUS AND METHOD

FIELD OF THE INVENTION

The present invention relates to a magnetic resonance imaging apparatus (hereinafter referred to as an "MRI apparatus") and method thereof using nuclear magnetic resonance phenomenon, particularly to the imaging technique suitable for measuring sensitivity distribution of a reception coil for receiving a nuclear magnetic resonance signal.

DESCRIPTION OF RELATED ART

In imaging using an MRI apparatus, the relationship between an imaging target region and sensitivity of a reception coil is a significant element for acquiring high quality images, and various techniques have been proposed such as the technique for correcting an image using sensitivity distribution of a reception coil or the imaging technique using the sensitivity distribution.

For example, the technique generally referred to as the shading correction corrects image distortion depending on the nonuniformity of reception sensitivity using sensitivity distribution of the reception coil (Patent Document 1, etc.). Also, there is a technique which obtains a composite image using a multiple-array coil in which a plurality of small-sized reception coils are disposed, by performing weighted addition on each image taken by each small-sized reception coil with sensitivity distribution of the respective small-sized reception coils.

Further, in the imaging method generally referred to as the parallel imaging, the unfolding operation of an image is performed by thinning the encode steps in the measurement space using a plurality of RF reception coils having different sensitivity distributions and using the image obtained for each RF reception coil and the reception sensitivity distribution of the respective RF reception coils (Non-patent Document 1).

As a general method for acquiring sensitivity distribution, there is a method which executes imaging using both a specified coil for each target region to be imaged and a coil capable of imaging a wide range so as to acquire sensitivity distribution by the operation using the both images.

Since imaging of the both images is executed independently, the imaging for these two images is generally executed separately in rotation. However, when the imaging positions of an object to be examined are displaced between the two executions of imaging, an error is caused in the sensitivity distribution for the calculation thereof. Also, since it takes several seconds to several tens of seconds for the execution of imaging, artifacts can be easily generated during the imaging by displacement of the object. The artifacts due to heartbeats or breathing appear as image errors in the phase encode and slice encode direction, but these kind of false images tend to be generated in irregular places, thereby causing the difference between the special coil and the wide-range coil. In such cases, the reception sensitivity can not be acquired accurately, which causes generation of artifacts after calculation of parallel imaging or in the image on which the shading correction is performed.

In order to solve this problem, the method which receives one echo by a whole-body coil and an array-coil by dividing each sampling period of an A/D conversion into at least two periods is proposed in Patent Document 2. However, the extremely high-speed switching of coils is required between the sampling processes, which makes it difficult to actually carry out the method with the current apparatuses. Also in the case of measuring one echo with two coils without changing the sampling intervals for reception, time TR is prolonged since the measurement time for one echo is prolonged, thereby causing attenuation of the echo signal during the measurement. On the other hand, in the case of measuring one echo with two coils without changing the measurement time, the sampling time needs to be reduced to half, which causes the lowering of SNR.

PRIOR ART PATENT DOCUMENTS

Patent Document 1: JP-A-H08-56928
Patent Document 2: JP-A-2002-65633
Non-Patent Document 1: SENSE: Sensitivity Encoding for Fast MRI (Klaas P. Pruessmann et al.), Magnetic Resonance in Medicine 42: 952-962 (1999)

The objective of the present invention, in the imaging for reconstructing an image of the information on an object or reception coils using the images in which echo signals are received by two or more different reception coils respectively, is to maintain simultaneity of the images obtained by the respective reception coils so that the influence due to movement of the object can be drastically reduced with respect to the information ultimately acquired as an image.

In particular, the method is proposed, in the case that the information ultimately obtained is the reception sensitivity distribution, capable of calculating the coil sensitivity in which the influence due to displacement of an object is substantially reduced and improving image quality by reducing artifacts in the parallel imaging or shading correction.

BRIEF SUMMARY OF THE INVENTION

In the MRI apparatus and method of the present invention, the reception means comprises at least two different kinds of reception coils, and a first and a second reception coil are switched for each echo in the same encode step. In this manner, the data from the two reception coils necessary for measuring sensitivity distribution can be acquired almost simultaneously, thereby making it possible to reduce the influence due to positional displacement of an object to be examined.

The MRI apparatus of the present invention comprises:
static magnetic field generation means;
gradient magnetic field generation means configured to generate gradient in the static magnetic field generated by the static magnetic field generation means;
high-frequency magnetic field transmission means configured to apply a high-frequency magnetic field to an examination target placed in a static magnetic field;
reception means configured to receive a nuclear magnetic resonance signal generated from the examination target;
control means configured to control the gradient magnetic field generation means, high-frequency magnetic field transmission means and reception means; and
signal processing means configured to process the nuclear magnetic resonance signal,
wherein:
the reception means comprises a first reception coil and a second reception coil which include the sensitivity region of the first reception coil and has the sensitivity region broader than that of the first reception coil; and
the control means executes the number of encode steps corresponding to (predetermined) k-space data while sequentially varying the application amount of a gradient magnetic field, controls acquisition of the data formed by a plurality of nuclear magnetic resonance signals while alternately switching the reception by the first reception coil and the reception by the second reception coil for each group (block) of 1 or more nuclear magnetic resonance signals in at least a part of the encode steps.

Also in the MRI apparatus of the present invention, the signal processing means comprises sensitivity distribution calculation means configured to calculate sensitivity distribution of the first reception coil using the nuclear magnetic resonance signal received by the first reception coil and the nuclear magnetic resonance signal received by the second reception coil. The sensitivity distribution calculation means calculates sensitivity distribution of the first reception coil by dividing the image created from the nuclear magnetic resonance signal received by the first reception coil by the image created from the nuclear magnetic resonance signal received by the second reception coil.

Further in the MRI apparatus in the present invention, the control means comprises actual imaging means configured to control the imaging for acquiring the nuclear magnetic resonance signal for imaging the biological information of the object using the first reception coil, and the signal processing means generates the image of the biological information of the object using the nuclear magnetic resonance signal acquired in the imaging by the actual imaging means and the sensitivity distribution of the first reception coil calculated by sensitivity distribution calculation means.

In accordance with the present invention, it is possible to practically execute reception by two reception coils simultaneously by switching the receptions in one encode step or in the block formed by a plurality of encode steps, thus when the processing is executed between images of two reception coils, the problem caused by the displacement of the object due to time difference between the two image acquisitions can be solved. Particularly in the case of acquiring sensitivity distribution in one of the reception coils by dividing the image acquired by one of the reception coils by the image acquired by the other reception coil, the influence due to the positional displacement of the object at the time of imaging can be significantly reduced.

BRIEF DESCRIPTION OF THE DRAWINGS

FIG. 1 is a general configuration of the MRI apparatus to which the present invention is applied.

FIG. 2 shows details of reception means.

FIG. 6 is for explaining deletion of artifacts by the division process.

FIG. 7 is a time chart of coil sensitivity measurement by a second embodiment.

FIG. 11 is for explaining another example of signal processing in the fourth embodiment.

DETAILED DESCRIPTION OF THE INVENTION

Figure 3:
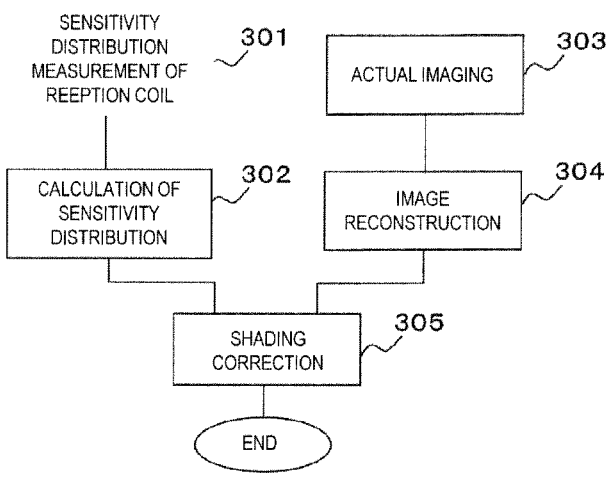
FIG. 3 shows the procedure of a first embodiment.

An embodiment of the present invention will be described in detail based on the attached diagrams.

FIG. 1 is a block diagram showing a general configuration of the MRI apparatus to which the present invention is applied. This MRI apparatus is for obtaining a tomographic image of an object using magnetic resonance phenomenon, and comprises a static magnetic field generating magnetic circuit 1, a gradient magnetic field generation system 2, a transmission system 3, a reception system 4, a signal processing system 5, a sequencer 6, a central processing unit (CPU) 7 and a console 8.

The static magnetic field generating magnetic circuit 1 is for generating a uniform static magnetic field around an object 9 in the body-axis direction or the direction orthogonal to the body-axis direction, wherein a permanent magnetic, normal conductive or superconductive magnetic field generation means is disposed in the space around the object 9.

The static magnetic field generation system 2 is formed by a gradient magnetic field coil 10 wound in three-axes directions of X, Y and Z and a gradient magnetic field power source 11 for driving the respective coils, configured to apply gradient magnetic fields Gs, Gp and Gf in the three-axes directions of X, Y and Z by a driving gradient magnetic field power source 11 of the respective coil according to the command from the sequencer 6. By the means of adding the gradient magnetic field, the slice plane with respect to the object 9 can be set.

The transmission system 3 is for irradiating a high-frequency signal for generating nuclear magnetic resonance in atomic nuclei of atomic elements forming biological tissues of the object 9 by the high-frequency magnetic field pulse outputted from the sequencer 6, formed by a high-frequency oscillator 12, a modulator 13, a high-frequency amplifier 14 and a high-frequency coil 15 on the transmission side, and an electromagnetic wave is irradiated to the object 9 by amplifying the high-frequency pulse outputted from the high-frequency oscillator 12 and supplying the amplified pulse to the high-frequency coil 15 which is placed in the vicinity of the object 9.

In the present embodiment, the high-frequency coil 15 is a wide-range imaging coil having the sensitivity region which covers approximately the entire measurement space (hereinafter referred to as a whole-body coil), which can be used not only for transmission but also for reception.

The reception system 4 is for detecting the echo signal (NMR signal) emitted from the nuclear magnetic resonance of the atomic nuclei in the biological tissues of the object 9, and is formed by a high-frequency coil 16 on the reception side, an amplifier 17, a quadrature phase detector 18 and an A/D converter 19. The high-frequency coil 16 specialized for reception has a narrow sensitivity range compared to the wide-range imaging coil, and is disposed in the vicinity of the object 9 (region of interest). Such a high-frequency coil 16 is referred to as a local coil or a specified coil.

Also in the present embodiment, since the high-frequency coil 15 on the transmission side also operates as the high-frequency coil on the reception side, the reception system switches the high-frequency coils 15 and 16 at the timing according to the command from the sequencer 6 and receives the nuclear magnetic resonance signal detected by one of them. The signal detected by the high-frequency coil 15 or 16 is inputted to the A/D converter 19 via the amplifier 17 and the quadrature phase detector 18, and converted into digital amount. At this time, the converted signal is made into two time-series of collection data which are sampled by the quadrature phase detector 18 at the timing according to the command from the sequencer 6, and transmitted to the signal processing system 5.

The signal processing system 5 is for performing the calculation for image reconstruction using the echo signal detected in the reception system 4 and displaying the reconstructed image, formed by the CPU 7 configured to execute processing such as the Fourier transform, correction coefficient calculation, sensitivity distribution calculation and image reconstruction with respect to echo signals and control of the sequencer 6, various storage devices 20~24, and a display 24 as a display unit configured to convert image data into a tomographic image and display the image. The storage device is formed by devices, for example a ROM (read only memory) 20 configured to store the invariable parameters to be used in the program or execution of the program for performing image analysis processing or measurement with time, a RAM (read-out and write-in memory) 21 configured to temporarily store measurement parameters, the echo signal detected in the reception system 4 and the image to be used for setting a region of interest and to store parameters, etc. for setting the region of interest, and an optical magnetic disk 22 or a disk 23 to be the data storage for recording the image data reconstructed by the CPU 7.

The sequencer 6 functions as control means for repeatedly applying the high-frequency magnetic field pulse which causes atomic nuclei of the atomic elements forming biological tissues of the object 9 to generate nuclear magnetic resonance at a predetermined pulse sequence, which operates under control of the CPU 7 so as to transmit various commands necessary for collecting the data for a tomographic image of the object 9 to the transmission system 3, the gradient magnetic field generation system 2 and the reception system 4. There are various kinds of pulse sequences according to the purpose of imaging or measurement, which are stored in signal processing system 5 in advance as a program.

The operation unit 8 is configured to input control information for the processing to be executed in the signal processing system 5, and is formed by a trackball 25 and a keyboard 26.

FIG. 2 shows the reception system 4 in detail which comprises two or more high-frequency coils as the high-frequency coil for reception. While one of the coils is a wide-range imaging coil (whole-body coil) 15 which also works as the high-frequency coil on the transmission side, and the other one is the specified coil 16 to be placed in the vicinity of the object in the present embodiment, the kind of coil is not limited thereto, and one or both coils may be the multiple coil in which a plurality of small-sized coils are disposed. In the case that the specified coil is the multiple coil formed by a plurality of small-sized reception coils, it comprises the same number of the reception systems 4 (an amplifier, quadrature phase detector and A/D converter) as the number of the small-sized reception coils.

As shown in the diagram, the wide-range imaging coil 15 is connected to one of the transmission system 3 or the reception system 4 via the transmission/reception changeover switch 27. The specified coil 16 is connected to the reception system 4 via a coil-changeover switch 28. While the transmission/reception changeover switch 27 and the coil-changeover switch 28 are drawn as a switch inserted between the respective coils 15 and 16 and the transmission system or the reception system in the diagram, a resonance circuit, etc. that switches the circuit of a coil between operation and non-operation modes can be provided, for example in a feeding unit of the whole-body coil 15 or a local coil 16 as switching means. In the present embodiment, the coil-changeover switches turn on or off according to the control timing subjected to the pulse sequence.

Since the gain of a receiver (the quadrature phase detector 18 and the A/D converter 19) generally has different optimal values depending on the coil, the optimal values suitable for the respective coils are acquired by pre-measurement and determined in accordance with the respective coils. Since the switching is performed frequently in the present embodiment and the timing for switching is very quick, there are cases that it is impossible to perform switching related to the present embodiment depending on the restrictions of hardware. In such cases, the minimum value from among the values acquired for the respective coils is to be set, and the gain value should be maintained constant without varying during the imaging.

Next, the imaging to be performed by the MRI apparatus having the above-described configuration will be described. The embodiment to be described below is the present invention applied to the measurement of sensitivity distribution in a reception coil to be used for an imaging (actual imaging) for obtaining an image of an object. The measurement of sensitivity distribution may be executed separately from the actual imaging, or may be executed using the signal acquired in the actual imaging. The actual imaging is not to be limited to a particular method, which can be applied to various methods of imaging that use sensitivity distribution in image reconstruction.

Embodiment 1

In the present embodiment, the imaging for measuring sensitivity distribution of a reception coil is to be executed (step 301) which is separate from the actual imaging (step 303) as shown in FIG. 3. In sensitivity distribution measurement 301, the imaging is executed using two kinds of reception coils which are a whole-body coil and a specified coil, and calculates sensitivity distribution of the specified coil using the image obtained by these two kinds of reception coils (step 302). The actual imaging is executed using the specified coil, and the image obtained by the specified coil (step 304) is corrected using the sensitivity distribution of the specified coil acquired in sensitivity distribution measurement 301 (step 305). The configuration of the specified coil is not particularly limited, and may be, for example the coil formed by a plurality of elements such as a multiple coil or a combination of a plurality of small-sized reception coils.

First, sensitivity distribution measurement 301 will be described.

Figure 4:
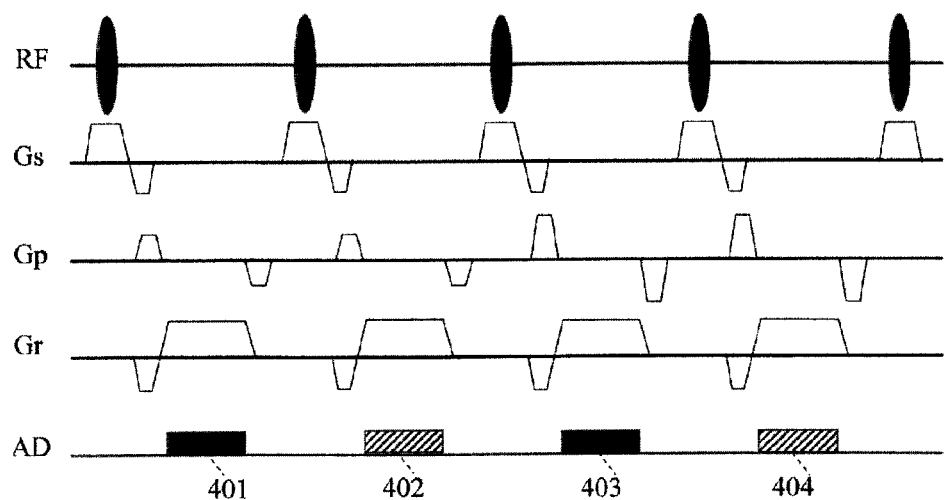
FIG. 4 is an example of the pulse sequence to be used for measurement of coil sensitivity in the first embodiment.

FIG. 4 is an example of the pulse sequence to be used for sensitivity distribution measurement of a reception coil. In the diagram, the RF, Gs, Gp and Gr respectively represent the application timing and intensity of a high-frequency pulse, gradient magnetic field pulse in the slice direction, gradient magnetic field pulse in the phase encode direction and gradient magnetic field pulse in the readout direction, and AD represents the sampling time of an echo signal. While this pulse sequence is an echo sequence of the general gradient type, it is different in that the same encode step is repeated for the number of reception coils (two times here) and the reception coil is switched for each echo signal during the encode step. Among the ADs, the black-colored parts 401 and 403 represent the reception by the specified coil, and shaded parts 402 and 404 represent the reception by the whole-body coil. In the case that the specified coil is a multiple coil formed by a plurality of small-sized reception coils, the reception is performed simultaneously by the plurality of small-sized reception coils. The RF is transmitted by the whole-body coil.

In the first encode step, the echo signal is measured by the specified coil, then the whole-body coil is switched from transmission to reception after applying a high-frequency pulse while a local coil is turned off, so as to measure the echo signal by the whole-body coil in the same encode step. In the next encode step, the whole-body coil is switched from reception to transmission while the specified coil is turned on, so as to receive the signal by the specified coil. In the same manner, a predetermined number of encode steps are repeated while switching the transmission and reception of the whole-body coil and switching the reception coils, so as to acquire the data for filling the k-space for each coil. While the size of k-space, i.e. the number of encode steps is 128, 256 and so on in the imaging for obtaining a standard object image, the smaller number, for example 32, 64 and so on is sufficient in the imaging for acquiring sensitivity distribution of a reception coil since a high space resolution is not required.

While the case that measurement is performed by setting the step having the smallest gradient magnetic field in the phase encode direction is set as the first encode step is shown in FIG. 4, the measurement order of the k-space is not limited thereto, and the measurement may be performed sequentially from −kmax to +kmax or may be performed by incrementing from phase encode 0 alternately in the negative direction and the positive direction by one step at a time.

Figure 5:
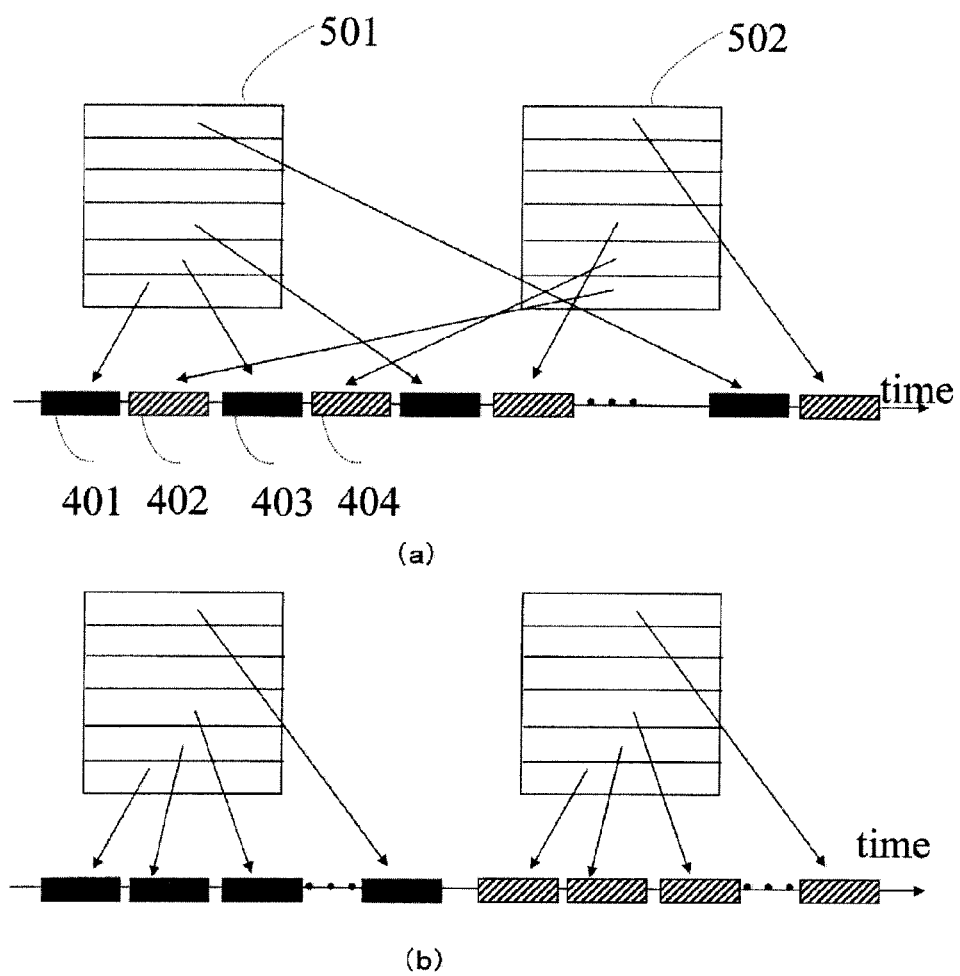
FIG. 5(a) is a time chart of coil sensitivity measurement by the first embodiment.
FIG. 5(b) is a time chart of coil sensitivity measurement by the conventional method.

FIG. 5(a) shows the timing chart of the above-described measurement and the arrangement example of the k-space data. Here, the represented example is a sequential measurement. As shown in the diagram, the data received by the specified coil is arranged in k-space 501, and the data received by the whole-body coil is arranged in a k-space 502. While the data space of one specified coil is shown in FIG. 5, when the specified coil is a multiple coil, the k-space data can be acquired for each reception coil which forms the multiple coil. Next, these k-spaces are Fourier transformed respectively so as to perform image reconstruction.

Then, sensitivity distribution of the specified coil is acquired by dividing the image obtained by the specified coil by the image obtained by the whole-body coil according to the following equation (1).

$$C_m = \frac{S_m}{\sqrt{S_{ar}^2 + S_{ai}^2}}$$ [Equation 1]

In the equation, Sm and Sa respectively represent the images obtained by a specified coil and a whole-body coil, and Cm represents the sensitivity distribution of the m-number of elements (small-sized reception coils) of a specified coil. Sm, Sa and Cm are complex data, and subscripts r and i respectively represents the real part and the imaginary part of the complex data (hereinafter the same meaning shall apply).

Also in the case that the specified coil is the multiple coil, coil sensitivity C in which the respective elements of the specified coil are combined can be expressed by the following equation (2).

$$C = \frac{\sum_{m=1}^{n} \sqrt{S_{mr}^2 + S_{mi}^2}}{\sqrt{S_{ar}^2 + S_{ai}^2}}$$ [Equation 2]

In the equation, n represents the number of elements in the multiple array coil.

In the region that there is no object, it is preferable to distinguish the region in advance and to calculate equation (1) or (2) by the interpolation processing from the acquired sensitivity distribution without executing the division process.

Since the sensitivity distribution is acquired by obtaining the whole-body coil image and the specified coil image practically at the same time in the above-described method, the influence by the positional change of the object due to the delay in acquisition times between the whole-body coil image and the specified coil image does not affect the sensitivity distribution. Also, since the signals of the same phase encode are acquired approximately at the same time to perform division process, the displacement of phases which affects the signal due to the movement can be solved even when the object moves, thereby making it possible to acquire extremely accurate sensitivity distribution. On the contrary in accordance with the conventional method shown in FIG. 5(b), since the imaging of the respective coils is executed independently, it is difficult to avoid error due to the movement of the object which possibly occurs between the imaging procedures and to eliminate the influence caused by the movement of the object during the imaging even by performing the division process.

FIG. 6 shows the pattern of a division process. As shown in the diagram, while there is a possibility that artifacts due to movement are generated on images 601 and 602 which are taken by the respective reception coils, since the artifacts are generated in the same patterns, reception coil sensitivity distribution 603 can be acquired more accurately by eliminating the influence due to the artifacts by the division process.

Various commonly known pulse sequences may be applied to actual imaging 303 to be executed separately from the above-described sensitivity distribution measurement, and the specified coil by which the sensitivity distribution is measured is to be used for the reception coil. The case that actual imaging 303 is the parallel imaging will be described below. In the parallel imaging, the combination of a plurality of reception coils having different sensitivity distributions is used. A variety of reception coils have been proposed to be used for the parallel imaging and any of those commonly known coils may be applied thereto.

Also in the parallel imaging, the data is acquired by thinning the phase encodes required for the imaging FOV (field of vision) according to the acceleration factor of measurement. The acceleration factor is the same number as the number of reception coils. In the case of reconstructing these data, the image is folded the same number of times as the acceleration factor in the phase-encode direction. Given this factor, in image reconstruction step 304 upon synthesizing the signals acquired in the respective reception coils, reconstruction of the image without folding is carried out by unfolding the image using sensitivity distribution Cm of the reception coils obtained by the equation (1). The concrete operation is expressed in the following equation (3).

[Equation 3]

$$M = C \cdot P$$
$$P = C^{-1} \cdot M$$ (3)

$$M = \begin{pmatrix} M_1 \\ M_2 \\ \vdots \\ M_m \end{pmatrix} \quad C = \begin{pmatrix} C_{1,1}, & C_{1,2}, & \ldots C_{1,2} \\ C_{2,1}, & C_{2,2}, & \ldots & C_{2,n} \\ & & \ddots & \\ C_{m,1}, & C_{m,2}, & \ldots C_{m,n} \end{pmatrix} \quad P = \begin{pmatrix} P_1 \\ P_2 \\ \vdots \\ P_n \end{pmatrix}$$

In the equation, M represents the signal value of the reception coil which is acquired in the actual imaging (m is the number of reception coils), C represents the sensitivity distribution for each FOV of the m-number of the respective reception coils (n is the number of FOV) and P1~Pn is the magnetization distribution in each FOV. By performing the determinant of matrix in the equation (3), magnetization distribution P in the entire FOV, i.e. the image without folding can be obtained.

In accordance with the present embodiment, since an accurate sensitivity distribution can be used for calculation, it is possible to obtain an accurate image without artifacts.

While an operation example using real-space data (image) is shown in the equation (3), there is also an unfolding operation using measurement-space data in the reconstruction operation in the parallel imaging, and an accurate image without artifacts can also be obtained in this case in the same manner as in the equation (3).

Next, the case in which actual imaging 303, without thinning phase encodes, is the standard imaging will be described. While the specified coil used for the actual imaging generally has a high sensitivity compared to a whole-body coil since it is placed in the vicinity of a region of interest, a certain region of the sensitivity is limited and has a low uniformity of sensitivity distribution compared to the whole-body coil. As a result, the image obtained by the actual imaging has the shading due to the sensitivity distribution of the reception coil. In image correction step 305, the above-mentioned shading is corrected by dividing image M(x,y) obtained by the actual imaging by sensitivity distribution C(x,y) acquired in sensitivity distribution calculation step 302 (equation (4)). The equation (4) is the same operation performed with one coil in the parallel imaging, and has the same value in which the respective elements of the reception coil are synthesized by sum of squares.

[Equation 4]

$$M_{corrected} = \frac{M(x, y)}{C(x, y)} \quad (4)$$

In the case that a specified coil is a multiple array coil, correction of sensitivity is executed by dividing real measurement image M(x,y) by coil sensitivity C (sensitivity for each image) which is synthesized with the respective elements obtained by the equation (2).

In the case that a specified coil is the combination of a plurality of small-sized reception coils, it is possible to synthesize the image using the following equation (5) by executing weighting on signal Mm acquired by the respective small-sized reception coils in the actual imaging using sensitivity distribution Cm of the respective small-sized reception coils obtained by the equation (1). In this case, the sensitivity distribution is used as the weight for the signal synthesis.

[Equation 5]

$$M_{sum} = \frac{\sum_{m=1}^{n} M_m \times C_m}{\sqrt{\sum_{m=1}^{n} C_m^2}} \quad (5)$$

In the diagram, $M_{sum}$ is the image taken by the actual imaging after the synthesis composition.

In accordance with the present embodiment, extremely accurate sensitivity distribution can be acquired even in the case that an object moved during sensitivity distribution measurement, by executing imaging for measurement of sensitivity distribution using a whole-body coil and a specified coil separate from the main imaging practically simultaneously with reception and calculate the sensitivity distribution by performing the division process on the image obtained from the signal received by the respective reception coils. In this manner, is it possible to perform an accurate unfolding operation, shading correction or multiple coil synthesis in the actual imaging using sensitivity distribution.

While a 2-dimensional pulse sequences of gradient echo type is exemplified in FIG. 4 as the pulse sequence for measuring sensitivity distribution, a 3D pulse sequence is to be used for the case of measuring 3-dimensional sensitivity distribution data. In this case, a slice encode is added in addition to the Gp (phase encode) axis, and switching of the reception coils is executed for each echo and also for the added slice encode within the same slice encode. In other words, in the case of 3D, switching of the reception coils is executed alternately on both coils with respect to every one increment for the slice encode and the phase encode respectively so as to execute imaging.

Also, while incoherent sequences of gradient echo type are exemplified which are suitable for a high-speed measurement in FIG. 4, the pulse sequence may be of the spin echo type.

Further, the pulse sequence for measuring sensitivity distribution may be combined with a commonly-known body-motion suppressing method. As for the body-motion suppressing method, there are, for example the measurement method to be performed being synthesized with biological signals such as breathing, electrocardiogram and a pulse wave, the false-image reducing method for normal motion performed by executing several times of breath-holding at separate times, and the method that physically reduces movement of a subject such as by using a belt, etc. By combining these methods, reduction of artifacts can be carried out in addition to the effect of division process even when the displacement caused by movement of a subject is great.

Embodiment 2

While the case that two reception coils are switched in a step with respect to every encode step in a sensitivity distribution measurement 301 is exemplified in embodiment 1, the switching of reception coils is executed not for every encode but for every block which is formed by two or more encode steps in the present embodiment. In this regard, however it is preferable that the measurement time for one block is sufficiently quick with respect to the movement of the subject.

FIG. 7 shows a timing chart in the case of switching two reception coils for every two phase encodes. In this case, an echo signal is measured by a first reception coil, e.g. a whole-body coil in a first encode step and a second encode step (701 and 702) then return the gradient magnetic field condition back to the first encode step, and measures the echo signal by a second reception coil, e.g. a specified coil in the first encode step and the second encode step (711 and 712).

Two encode steps are repeated twice in the same manner as a unit, and the reception by the first coil and the reception by the second reception coil are repeated for every repetition (703, 704, . . . , 713 and 714).

In the present embodiment also, since the image by the first reception coil (whole-body coil) and the image by the second reception coil (specified coil) are obtained practically at the same time, it is possible to acquire extremely accurate sensitivity distribution without being affected by positional displacement of an object due to delay of signal acquisition or by movement of the object during imaging.

It is the same as the first embodiment in which the acquired sensitivity distribution is used for correction or synthesis of the image of the actual imaging which is separately executed.

Modification Example of Embodiment 1 and Embodiment 2

While the case that the reception by the first reception coil and the reception by the second reception coil are switched over the entire region of a k-space is exemplified in the first and second embodiments, the switching of the reception coils may be executed by dividing the k-space and measuring only a part of the region, e.g. a low-frequency region. In this case, the reception coils are alternately switched for every step of the phase encode and the slice encode with respect to a low-frequency region, and as for the high-frequency region the measurement is executed by switching the reception coils for one time or the fewer times compared to the low-frequency region.

Generally image contrast is determined by the data of the low-frequency region and the information of sensitivity distribution is reflected more in the data of the low-frequency region, thus the influence due to the movement of an object during a given time does not affect the high-frequency region very much even though the frequency of switching the reception coils is reduced. Therefore, an accurate sensitivity distribution can also be acquired in the present modification example by eliminating the influence due to the movement of an object, in the same manner as in the first and the second embodiments.

Embodiment 3

While the pulse sequence of the single echo that measures one echo after one time of spin excitation is exemplified in sensitivity distribution measurement in the first embodiment and the second embodiment, the multi-echo sequence is applied in the present embodiment and each of a plurality of echoes acquired in the same shot are received by different reception coils.

Figure 8:
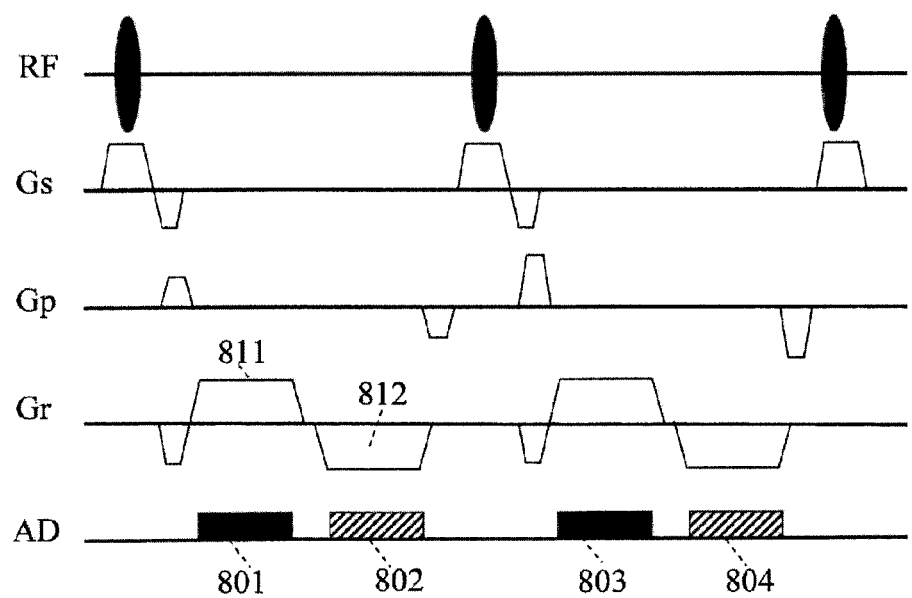
FIG. 8 is an example of the pulse sequence to be used for coil sensitivity measurement in a third embodiment.

FIG. 8 shows an example of the pulse sequence to be applied in the present embodiment. The reference numerals for the respective axes in FIG. 8 are the same as in FIG. 4, black-colored parts 801 and 803 of AD represent the reception by a specified coil and shaded parts 802 and 804 represent the reception by a whole-body coil. Also while 2-dimensional pulse sequences of the gradient echo type are shown in FIG. 8 in the same manner as in FIG. 4, 3-dimensional pulse sequences added with the slice encode or pulse sequences of spin echo type may be used instead.

As shown in the diagram, in the present embodiment, a first readout gradient magnetic field pulse 811 and a second readout gradient magnetic field pulse 812 in which the polarity of the first pulse 811 is reversed are applied after the high-frequency pulse RF is applied, and the echo signal is measured while the respective readout gradient magnetic field pulses are applied (801 and 802). At that time, the reception coils are switched for each echo, for example the first echo signal is received by the whole-body coil and the second echo signal is received by the local coil. In the same manner, the reception coils are switched between measurements of the two echo signals generated after one time of RF application while sequentially incrementing the encode step, and the two echoes are received by different reception coils.

In this way, reconstruction of images using the signals measured for each reception coil and acquisition of sensitivity distribution for the reception coils from two images are carried out in the same manner as the first embodiment. As in the first and the second embodiments, an accurate sensitivity distribution can be acquired by eliminating the influence due to movement of an object. Also in the present embodiment, since the echoes for two reception coils are generated in the same phase encode step, measurement time can be reduced more than in the first and the second embodiments.

While the case of generating two echoes is exemplified in FIG. 8, the number of echoes may be more than two. For example, the number of echoes may be four so that two echoes are received and added at a time by the whole-body reception coil and the specified coil respectively.

Embodiment 4

Figure 9:
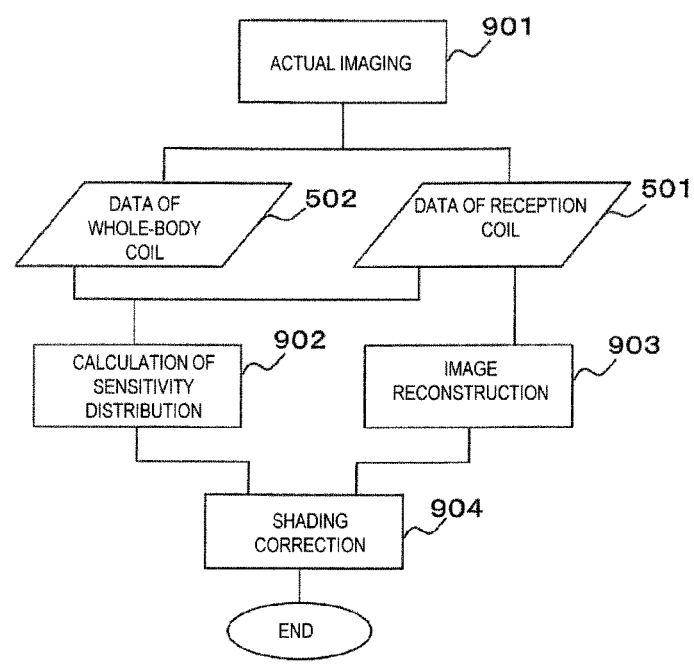
FIG. 9 is the procedure in a fourth embodiment.

While the imaging for measuring sensitivity distribution is executed separately from the actual imaging in the above-described embodiments, it is also possible to use the signal measured in the actual imaging for sensitivity distribution measurement. FIG. 9 shows the procedure of the method thereof.

First in imaging step 901, a predetermined pulse sequence is executed using a whole-body coil and a specified coil as the reception coil. The pulse sequence may be, as shown in FIG. 4 or FIG. 8, the single echo sequence which measures one echo in one shot or the multi-echo sequence may be used. From a perspective that there is not enough time to repeat an echo step twice, the multi-echo sequence is more preferable. In this regard however, the number of encodes must be sufficient enough to acquire the spatial resolution required for obtaining an image of an object since the signal acquired by the reception coil is used here for the image reconstruction.

Figure 10:
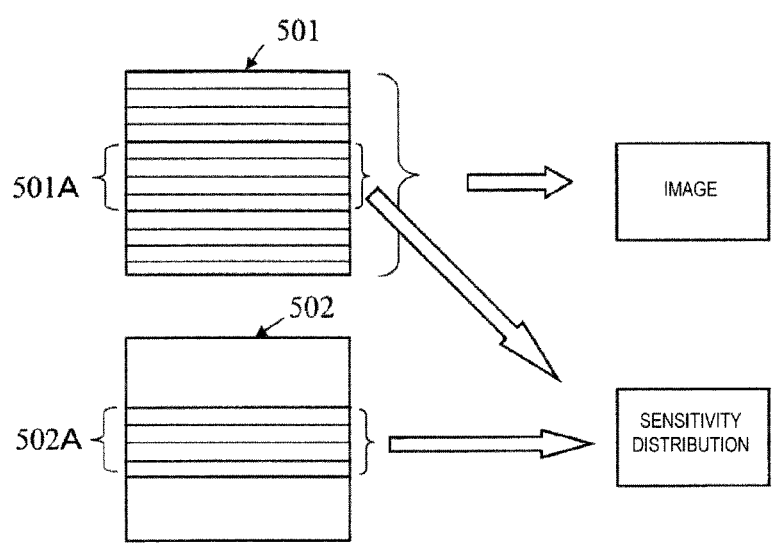
FIG. 10 is for explaining an example of signal processing in the fourth embodiment.

In the imaging step, the whole-body coil and the specified coil are switched for the reception of the signal for every phase encode step or for every block formed by a plurality of encode steps, at least at the time of measuring the low-frequency region data. This procedure is the same as in the first~third embodiments, and the data for the entire encode may be acquired both in the whole-body coil and the specified coil. At this time, for example the switching of the reception coils may be executed only upon measuring the low-frequency region, and only data 502A of the low-frequency region may be acquired with respect to the whole-body coil as shown in FIG. 10.

Since K-space data 502 measured by the whole-body coil and k-space data 501 measured by the specified coil can also be acquired as shown in FIG. 5 also in the present embodiment by executing the above-mentioned pulse sequences, an image is reconstructed using these two k-space data and sensitivity distribution of the specified coil is acquired by performing the division process on the reconstructed images (step 902). In prior to the division process, the acquired image is performed with the filtering process using an LPF, etc. as need arises. As shown in FIG. 10, in the case that the reception by the whole-body coil is executed only in a low-frequency region 502A, the k-space data of the specified coil to be used for calculation of the sensitivity distribution is set as data 501A of the same low-frequency region as the data of the whole-body coil. The operation for acquiring the sensitivity distribution is the same as the one in the first embodiment, thus the sensitivity distribution of the specified coil is calculated by the equation (1) or the equation (2).

Next, an image is reconstructed using the k-space data acquired by the specified coil (step 903). At this time, the shading correction is performed on the image using the sensitivity distribution acquired in step 902 (step 904). Or in the case that the specified coil is a multiple coil, the images of the respective small-sized reception coils are synthesized using the sensitivity distribution of the respective small-sized reception coils by which the multiple coil is formed as the weight.

In accordance with the present embodiment, since sensitivity distribution is measured using the echo signals measured in the actual imaging, it is possible to reduce the entire measurement time compared to the case which executes measurement of sensitivity distribution separately.

While the case that executes the shading correction in an actual imaging is exemplified in the fourth embodiment, sensitivity distribution measurement can also be executed using the echo signal measured in the actual imaging in the case that the actual imaging is the parallel imaging which executes measurement by thinning the phase encodes. In that case, for example as shown in FIG. 11, data 501A and 502A are respectively collected by a whole-body coil and a specified coil without thinning the phase encodes with respect to the low-frequency region, and the collected data of the region is used for calculating the sensitivity distribution. Since the specified coil is formed by a plurality of (m-number in the diagram) reception coils in the parallel imaging, the sensitivity distribution is calculated for the plurality of reception coils respectively. Next, modifications can be added such as executing unfolding by the parallel imaging so as to obtain an image using the data acquired by the encode step width as the data of a high-frequency region from among data 501 of the specified coil measured by thinning the phase encodes, i.e. high-frequency region data 501B and low-frequency region data 501A and the sensitivity distribution of the specified coil.

The variety of modification examples in the first-third embodiments can also be applied to the above-described fourth embodiment. For example, the 2-dimensional pulse sequence can be changed to the 3-dimensional sequence, and the measurement order of the k-space may be either sequential or centric.

Also, modifications such as automatically adjusting the gain of the reception coil to the minimum setting or combining with the synthesis imaging may be properly applied thereto.

INDUSTRIAL APPLICABILITY

In accordance with the present invention, it is possible to drastically reduce the influence due to the movement of an object during imaging and acquire accurate sensitivity distribution of a reception coil. By using such acquired sensitivity distribution, the unfolding operation can be accurately performed in the shading correction or the parallel imaging, thereby making it possible to obtain an image without artifacts.

DESCRIPTION OF THE REFERENCE NUMERALS

1: static magnetic field generating magnetic circuit, 2: gradient magnetic field generation system, 3: transmission system, 4: reception system, 5: signal processing system, 6: sequencer, 7: CPU (control system), 8: console

The invention claimed is:

1. A magnetic resonance imaging apparatus comprising:
magnet to generate a static magnetic field;
gradient magnetic field generator to generate a gradient magnetic field in the static magnetic field;
high-frequency magnetic field transmitter to apply a high-frequency magnetic field to an examination target placed in the static magnetic field;
receiver to receive a nuclear magnetic resonance signal generated from the examination target;
controller to control the gradient magnetic field generator, the high-frequency magnetic field transmitter and the receiver; and
signal processor to process the nuclear magnetic resonance signal,
wherein:
the receiver comprises a first reception coil and a second reception coil having a sensitivity region including a sensitivity region of the first reception coil and is wider than the sensitivity region of the first reception coil; and
the controller executes encode steps corresponding to k-space data while sequentially varying application amount of the gradient magnetic field, controls acquisition of data formed by a plurality of nuclear magnetic resonance signals, and alternately switches reception by the first reception coil and reception by the second reception coil for every one or more groups of nuclear magnetic resonance signals in at least a part of the encode step of a gradient echo sequence to measure one gradient echo after applying one high-frequency magnetic field.

2. The magnetic resonance imaging apparatus according to claim 1, wherein the second reception coil is a whole-body coil which additionally operates as a transmission coil comprised in the high-frequency magnetic field transmitter.

3. The magnetic resonance imaging apparatus according to claim 1, wherein the first reception coil is a local coil which receives signals from a region of interest in the examination target.

4. The magnetic resonance imaging apparatus according to claim 3, wherein the first reception coil is a multiple coil formed by a plurality of small-sized reception coils, and sensitivity distribution regions of the respective small-sized coils are different from one another.

5. The magnetic resonance imaging apparatus according to claim 1, wherein the controller switches the reception by the first reception coil and the reception by the second reception coil the to collect low-frequency region data in a k-space from among the encode steps corresponding to the k-space data.

6. The magnetic resonance imaging apparatus according to claim 1, wherein the controller executes another multi-echo sequence for acquiring two or more nuclear magnetic resonance signals in one encode step, controls the receiver so that one of the two or more nuclear magnetic resonance signals is received by the first reception coil and the other signal is received by the second reception coil.

7. The magnetic resonance imaging apparatus according to claim 1, wherein the signal processor calculates a sensitivity distribution of the first reception coil using the nuclear magnetic resonance signal received by the first reception coil and the nuclear magnetic resonance signal received by the second reception coil.

8. The magnetic resonance imaging apparatus according to claim 7, wherein the signal processor calculates the sensitivity distribution of the first reception coil by dividing an image created using the nuclear magnetic resonance signal received by the first reception coil, by an image created using the nuclear magnetic resonance signal received by the second reception coil.

9. The magnetic resonance imaging apparatus according to claim 7, wherein:

the controller acquires the nuclear magnetic resonance signal for imaging biological information of the examination target using the first reception coil; and the signal processor generates an image of the biological information of the examination target using the acquired nuclear magnetic resonance signal and the sensitivity distribution of the first reception coil.

10. The magnetic resonance imaging apparatus according to claim 9, wherein the controller executes switching of the reception by the first reception coil and the reception by the second reception coil in the imaging of the biological information of the examination target.

11. The magnetic resonance imaging apparatus according to claim 9, wherein the controller executes measurement, which is separate from actual imaging, for acquiring the nuclear magnetic resonance signal for measuring the sensitivity distribution of the first reception signal, and executes switching of the reception by the first reception coil and the reception by the second reception coil in the measurement.

12. The magnetic resonance imaging apparatus according to claim 9, wherein:

the first reception coil is a local coil configured to receive the signal from a region of interest in the examination target; and the signal processor executes shading correction of the image generated from the nuclear magnetic resonance signal, using sensitivity distribution of a local coil.

13. The magnetic resonance imaging apparatus according to claim 9, wherein:

the first reception coil is a multiple coil formed by a plurality of small-sized reception coils and the reception coils have respective different sensitivity distribution;

the controller collects the nuclear magnetic resonance signals that may cause folding in an image by executing a number of encode steps which is fewer than the number of encode steps corresponding to the k-space data; and the signal processor generates an image without folding using sensitivity distribution of the respective small-sized reception coils at the time of generating the image using the nuclear magnetic resonance signal.

14. The magnetic resonance imaging apparatus according to claim 1, wherein:

the reception means comprises gain measuring means configured to measure a reception gain of a reception coil; and the controller sets reception gain of the reception means at the minimum reception gain from among the reception gains of the respective reception coils measured by the gain measuring means, at the time that the reception by the first reception coil and the reception by the second reception coil are switched.

15. The magnetic resonance imaging apparatus according to claim 1, further comprising periodic-motion signal inputting means configured to input the signal from means to measure periodic motion of the examination target, wherein the controller, in the measurement of the nuclear magnetic resonance signal including switching of the reception by the first reception coil and the reception by the second reception coil, measures the nuclear magnetic resonance signal by synthesizing with the signal inputted by the periodic-motion signal inputting means.

16. A magnetic resonance imaging method performed by a magnetic resonance imaging apparatus including a first reception coil and a second reception coil including a sensitivity region of the first reception coil and has a sensitivity region wider than that of the first reception coil, the magnetic resonance imaging method comprising:

executing by the magnetic resonance imaging apparatus encode steps corresponding to k-space data while sequentially varying application amount of a gradient magnetic field;

controlling by the magnetic resonance imaging apparatus acquisition of data formed by a plurality of nuclear magnetic resonance signals; and alternately switching by the magnetic resonance imaging apparatus reception by the first reception coil and reception by the second reception coil for each group of one or more nuclear magnetic resonance signals in at least a part of the encode step of a gradient echo sequence to measure one gradient echo after applying one high-frequency magnetic field.

17. The magnetic resonance imaging method according to claim 16, wherein the second reception coil is a whole-body coil which additionally operates as a transmission coil.

18. The magnetic resonance imaging method according to claim 16, wherein the first reception coil is a local coil configured to receive a signal from a region of interest in the examination target.

19. The magnetic resonance imaging method according to claim 18, wherein the first reception coil is a multiple coil formed by a plurality of small-sized reception coils and each of the small-sized reception coils has a different sensitivity distribution region.

20. The magnetic resonance imaging method according to claim 16, further comprising switching the reception by the first reception coil and the reception by the second reception coil while collecting low-frequency region data in a k-space from among the encode steps corresponding to the k-space data.

* * * * *